Sept. 20, 1966 F. A. LAPINSKI 3,274,586
ELECTRICAL APPARATUS
Filed Oct. 22, 1963
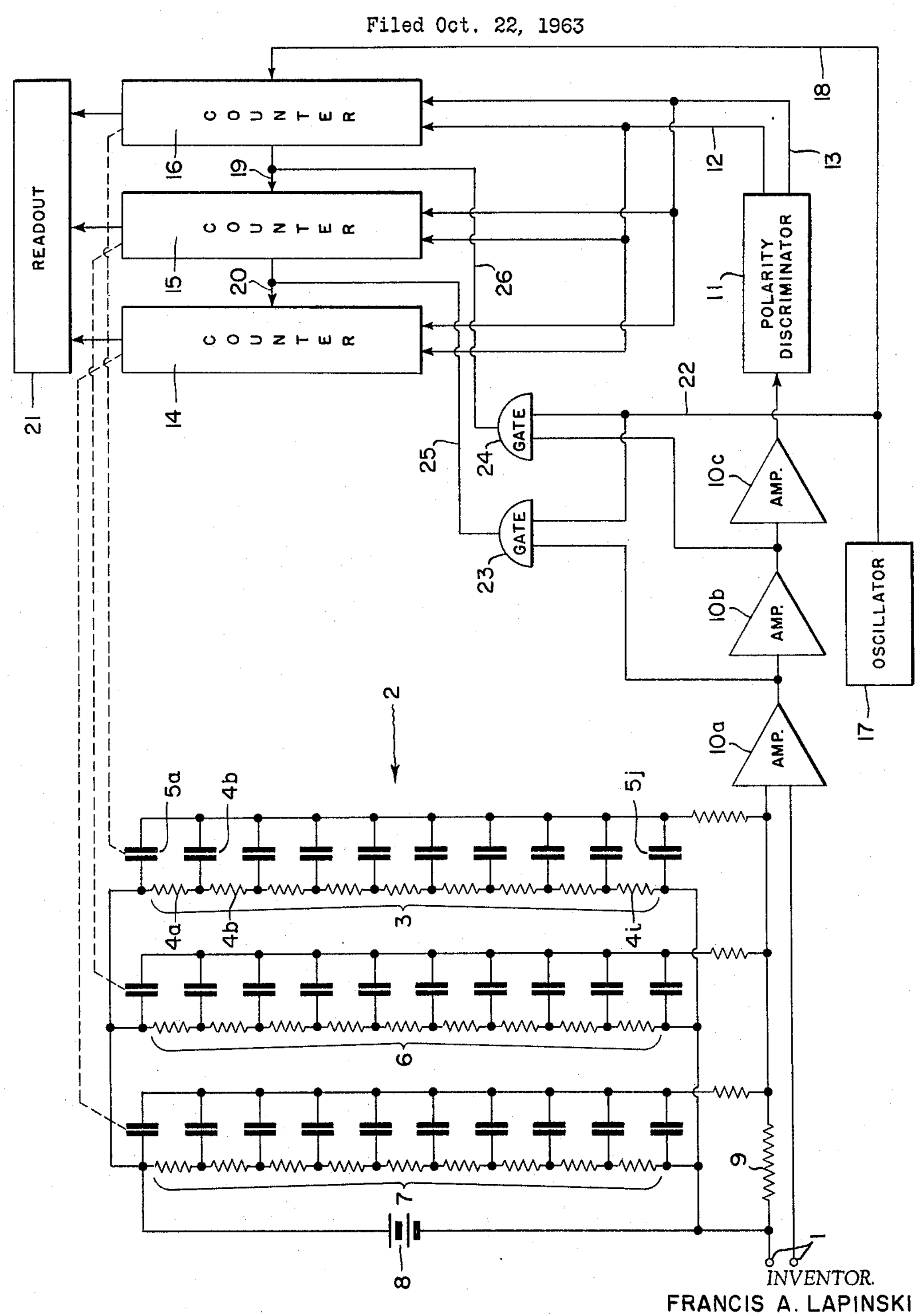
INVENTOR.
FRANCIS A. LAPINSKI
BY Arthur H. Swanson
ATTORNEY.

3,274,586
Patented Sept. 20, 1966

United States Patent Office 3,274,586

ELECTRICAL APPARATUS

Francis A. Lapinski, Ambler, Pa., assignor to Honeywell Inc., Minneapolis, Minn., a corporation of Delaware Filed Oct. 22, 1963, Ser. No. 317,985
9 Claims. (Cl. 340—347)

This invention relates to analog signal data handling apparatus. More specifically, the present invention relates to analog to digital converters.

An object of the present invention is to provide an improved analog to digital converter.

Another object of the present invention is to provide an analog to digital converter having an automatically variable digital conversion speed.

Still another object of the present invention is to provide an improved analog to digital converter having a plurality of digital conversion speeds.

A further object of the present invention is to provide an improved analog to digital converter having means for temporarily varying a digital conversion speed in response to the relative magnitude of an unknown signal to be digitized.

A still further object of the present invention is to provide an improved analog to digital converter, as set forth herein, having a simplified operation and construction.

In accomplishing these and other objects, there has been provided, in accordance with the present invention, an analog to digital converter having a plurality of sequentially connected bidirectional decade counting circuits operative to adjust a reference signal in corresponding decade steps. A polarity discriminator is used to sense the polarity of an error signal representative of the difference between a signal to be digitized and the reference signal. The output signal of the discriminator is arranged to simultaneously control the counting direction of all of the counting circuits. An oscillator is provided to supply a signal having cycles to be counted to the first one of the counting circuits. The error signal detected by the discriminator is first amplified by an amplifier having a plurality of amplifying stages. A counter speed-up means is provided to selectively apply the output signal from the oscillator to other ones of the counting circuits. The speed-up means is arranged to sense the output signal of each of the amplifying stages, except the last stage, used to amplify the error signal. The magnitude of each of these stage output signals is used to control a gate circuit to apply the oscillator output signal to a respective one of the counting means.

A better understanding of the present invention may be had when the following detailed description is read in connection with the accompanying single figure drawing which is a schematic illustration of an analog to digital converter embodying the present invention.

Referring to the single figure drawing in more detail, there is shown an analog to digital converter embodying the present invention. A pair of input terminals 1 are arranged to be connected to a source of an unknown analog signal to be digitized. A variable reference signal circuit 2 is provided to supply a feedback signal to be compared with the unknown signal. The reference circuit 2 comprises a plurality of decade feedback signal circuits, three of which are shown for example, each having a plurality of resistance elements and related relay contacts. Thus, a first decade circuit 3 has a plurality of resistors *4a, 4b, . . . , 4i* and corresponding relay contacts *5a, 5b, . . . , 5j*. Similarly, a second decade circuit 6 and a third decade circuit 7 are provided to supply additional levels of feedback reference signals. The decade circuit (hereinafter referred to as decade) resistance elements are connected in series to form the decade, and the decades are connected in parallel across a reference power supply 8.

The reference signals supplied by each decade are summed in feedback resistor 9 and connected in opposition to the unknown input signal. The combination of the feedback signal and the unknown signal is effective to develop an error, or difference, signal. This error signal is amplified by an error amplifier having a plurality of amplifying stages 10*a*, 10*b* and 10*c*. The output signal from the last one of these stages is applied to a polarity discriminator 11. The discriminator 11 may be any suitable device for providing a separate output signal for a corresponding polarity of the error signal applied thereto; such devices being well-known in the art. Thus, the discriminator 11 provides an output signal on an output line 12 when the error signal indicates a reference signal smaller than the unknown. The signal on line 12 is indicative of the need to increase the reference signal to decrease the error signal. On the other hand, an output signal from the discriminator on an output line 13 is indicative of a reference signal larger than the unknown signal and is used, as hereinafter described, to decrease the reference signal. In other words, the output signals from the discriminator 11, in either case, are used to control the reference signal to decrease the error signal in order to provide a reference signal equal to the unknown signal. Lines 12 and 13 are connected to separate inputs of three bidirectional decade counting circuits 14, 15 and 16. The signals appearing on lines 12 and 13 are effective to control the direction of counting of the counters 14, 15 and 16.

An oscillator 17 is provided to supply a signal having cycles to be counted to the first counter 16 along a line 18. Thus, counter 16 is used to count the cycles of the oscillator output signal. Further, the direction of the count is determined by the selective energization of lines 12 and 13; i.e., the counts stored in the counter 16 are selectively either increased or decreased. The counter 16 is used to control the relay contacts *5a, 5b, . . . , 5j*. In other words, as the count in the counter 16 is changed, the relay contacts are progressively actuated. Each relay contact is effective to apply the signal appearing at the junction of its associated resistors to the summing resistor 9. Thus, the signal supplied to summing resistor 9 is progressively varied under the control of the counters 14, 15 and 16. The resistors *4a, 4b, . . . , 4i* are weighted to provide steps in the feedback signal supplied to resistor 9. Specifically, in one embodiment, the first counter 16 is operated as a units counter and the resistors *4a, 4b, . . . , 4i* are each arranged to vary the feedback signals in equal one unit steps. For example, with the operation of a relay contact associated with the sixth resistor, the feedback signal has a magnitude of 6 units.

Similarly, the second counter 15 is used to step the relay contacts of the second decade 6 with the resistors in the second decade 6 each being weighted to change the feedback signal by equal ten unit steps. The third counter 14 is arranged to control the relay contacts of the third decade 7 having resistors weighted to provide a feedback signal change of equal hundred unit steps. For example, a relay connection to six unit resistors, five ten-unit resistors and three hundred-unit resistors would provide a total feedback signal of three hundred fifty-six units.

The counters 14, 15 and 16 are interconnected to provide a sequential bidirectional count of the signal from the oscillator 17. Thus, a completed operation of the first counter; i.e., ten counts, is effective to provide a single count signal along line 19 to the second counter 15. Thus, the second counter 15 is stepped one count for each ten counts of the first counter 15. Similarly, the end of an operation of the second counter is applied to the third counter 14 along line 20. Conversely, a reversal of the count direction in the first counter 16 under control of the discriminator 11 is effective to provide a count signal along line 19 upon the count in the first counter 16 reaching zero. Similarly, a reversal of the count direction in the second counter 15 provides a count signal to the third counter 14 upon a zero count in the second counter 15. Thus, the counters 14, 15 and 16 are interrelated to count up or down under control of the discriminator 11. The count positions of the counters 14, 15 and 16 are communicated to a readout device 21 which may provide a visual digital display or the like, of the count stored in the counters 14, 15 and 16 as a representation of the unknown signal.

The output signal from the oscillator 17 is also applied along line 22 to two signal gate circuits 23 and 24 in the embodiment shown herein. These gate circuits 23 and 24 are effective to transfer the oscillator signal to output lines 25 and 26, respectively, under the control of corresponding gating signals. These gating signals are derived from the output signals of the first two of the three error signal amplifying stages 10*a*, 10*b* and 10*c*. Thus, the output signal from the first stage 10*a* is used to control the first gate 23, and the second stage 10*b* signal controls the second gate 24. The output signals from the gates 23 and 24 are connected to the counter interconnecting lines 19 and 20 to apply the oscillator output signal directly to the respective counter. In other words, gate 23 is arranged to apply the oscillator signal directly to counter 14; and gate 24 applies the oscillator signal directly to counter 15.

In operation, the present invention is effective to compare a feedback signal developed across resistor 9 with the unknown signal applied to input terminals 1. This comparison is arranged to provide an error signal having a magnitude representative of the difference between the compared signals and a polarity dependent on the relative magnitude of the reference signal and the unknown signal; i.e., which one has a larger magnitude. Assuming a constant polarity of the input signal, the polarity discriminator 11 is effective to produce an output signal on either line 12 or line 13 depending on the aforesaid polarity relationship. The output signal from discriminator 11 is simultaneously applied to counters 14, 15 and 16 to determine the direction of their counting operations.

The cycles of the signal from oscillator 17 are counted by the counters 14, 15 and 16 to provide a sequential mode of operation of the relay contacts of the decades 3, 6 and 7. In other words, the units counter 16 counts the individual cycles of the oscillator signal and produces an output on line 19 for each ten cycle counts, and the tens counter 15 counts each output signal for the units counter 16 and produces an output on line 20 for each ten signals from counter 16. When the reference signal becomes greater than the unknown signal as a result of the increasing count of the counters 14, 15 and 16, the polarity of the error signal will reverse. This reversal is detected by the discriminator 11 and its output signal is shifted from one of the lines 12 and 13 to the other.

The counters are now operated to decrease their count in response to the further cycles of the oscillator output signal. Thus, starting with the units decade, the reference signal is reduced in steps of units, tens and hundreds by the signals on lines 19 and 20 until the polarity is again reversed. This process continues with polarity reversals and consequent change in counting direction until the reference signal is equal to the unknown signal. The adjustment operation of the reference signal is effective to decrease the error signal as the reference signal is adjusted toward the unknown signal magnitude.

In the event that the error signal has a large magnitude indicative of a substantial discrepancy between the reference signal and the unknown signal, it is desirable to speed-up the digitizing operation to quickly vary the reference signal in order to decrease the time required for a digitizing cycle. This speed-up operation is effected by applying the oscillator signals directly to selected ones of the counters 14, 15 and 16 controlling the higher level steps in the reference signal. In the embodiment shown herein the selection operation is arranged to be dependent on several corresponding magnitude levels of the error signal. Thus, an error signal having an intermediate magnitude is effective to be arranged to bring into operation the tens level counter 15 and a large error signal is effective to affect the operation of the hundreds level counter 14 and the tens level counter 15. The foregoing is accomplished by providing gate circuits 23 and 24 which are each responsive to a different level of a gating signal. The oscillator output signal is connected to both gate circuits 23 and 24. The gating control signals from the gates 23 and 24 are independently derived from the output signals of the first amplifying stage 10*a* and the second amplifying stage 10*b*, respectively. An error signal which is effective to open gate 24 is the result of an amplification by stages 10*a* and 10*b*. The opening of this gate is effective to apply the oscillator signal directly to counter 15 along line 26 to line 19. However, this error signal after amplification by only the first stage 10*a* is insufficient to operate the first gate 23.

A large error signal is effective after amplification by the first stage 10*a* to operate the first gate 23 and the second gate 24. Thus, a large error signal is effective to apply the oscillator signal to the second and third counters 14 and 15. Of course, in either case, the oscillator signal is still applied to the first counter 16. In summary, the magnitude of the error signal is effective to selectively control the operation of the first counter 16, the first and second counters 16 and 15 and the first, second and third counters 16, 15 and 14 by a small error signal, an intermediate error signal and a large error signal, respectively. The direction of counting of the counters 14, 15 and 16 is controlled by discriminator 11, in all cases, but the rate of change of the reference signal is controlled by the magnitude of the error signal. Thus, the large error signal is quickly decreased by simultaneous operation of a combination of the counters 14, 15 and 16 with a final adjustment of the reference signal being provided by the units level counter 16.

Accordingly, it may be seen that there has been provided in accordance with the present invention, an analog to digital converter having an automatically variable speed of digitizing operation to provide a plurality of digitizing speeds in response to a comparison between an unknown signal and a reference signal.

What is claimed is:

1. An analog to digital converter comprising, a plurality of bidirectional counting means connected in series to form increasing decade steps whereby a completion of a count in either direction in one of said counting means is effective to transfer a count signal to a succeeding adjacent one of said counting means, said counting means each including selectively responsive control means operative to determine the direction of a count in the respective ones of said counting means, reference signal supply means controlled by said counting means and operative to supply a plurality of weighted steps in the magnitude of a reference signal in response to a count in a corresponding one of said counting means, signal comparing means operative to compare the reference signal with an unknown signal to be digitized to provide a difference signal having a magnitude representative of the error between said reference signal and said unknown signal and a polarity representative of the direction of said error, polarity discriminating means responsive to said difference signal to provide a control signal indicative of said polarity, means connecting said control signal to all of said control means to determine the direction of the count in said counting means, oscillator means connected to the first one of said counting means to provide signals to be counted thereby, and signal gate means responsive to a plurality of magnitudes of said difference signal and operative to selectively apply said signals from said oscillator means to ones of said counting means other than said first one in response to a corresponding magnitude of said difference signal.

2. An analog to digital converter as set forth in claim 1 wherein said gate means includes a plurality of sequentially connected amplifying stages for said difference signal, and a plurality of gate circuits for said signal from said oscillator means, said gate circuits being connected to respond to different gating control signal levels derived from respective ones of said amplifying stages.

3. An analog to digital converter comprising a plurality of reference signal producing means arranged to produce respective groups of weighted reference signals with said groups progressing during the operation of said means from least significant to most significant with respect to the magnitude of the reference signals by having said means interconnected to produce a sequential step operation of a succeeding one of said means for each complete operation of a preceeding one of said means, signal comparing means operative to compare a reference signal from said signal producing means with an unknown signal to be digitized to provide a control signal representative of the error between the compared signals, circuit means applying said control signal to said signal producing means to control the sequential operation of said signal producing means, sequential energizing signal means connected to said signal producing means for said least significant of said groups of reference signals to produce a sequential operation thereof under control of said control signal, and a speed-up means including a plurality of signal gate means each responsive to a respective magnitude of the error between said compared signals and operative to apply signals from said sequential signal means to corresponding ones of said signal producing means other than said signal producing means for said least significant of said groups of reference signals in response to a corresponding magnitude of said error.

4. An analog to digital converter as set forth in claim 3 wherein said speed-up means includes a plurality of amplifying means sequentially connected and arranged to amplify said error, and means connecting each of said gate means to respond to different gate signal levels derived from respective ones of said amplifying stages.

5. An analog to digital converter comprising a plurality of bidirectional stepping means connected in series whereby a completion of an operation in either direction of one of said stepping means is effective to transfer a step producing signal to a succeeding adjacent one of said stepping means, each of said stepping means including selectively operable control means effective to determine the direction of a step in the respective one of said stepping means, reference signal supply means controlled by said stepping means and operative to supply a plurality of weighted steps from a least significant to a most significant in the magnitude of a reference signal in response to an operation of said stepping means, signal comparing means operative to compare the reference signal with an unknown signal to be digitized to provide a difference signal having a magnitude representative of the error between the compared signals and a polarity representative of the direction of the error, polarity discriminating means responsive to said difference signal to provide a control signal indicative of said polarity, means connecting said control signal to all of said control means to determine the direction of the operation of said stepping means, sequential energizing signal supply means connected to the first one of said stepping means to provide signals to step said stepping means and signal gate means, and signal gate means responsive to a plurality of magnitudes of said difference signal and operative to selectively apply signals from said energizing signal supply means to ones of said stepping means other than said first one in response to a corresponding magnitude of said difference signal.

6. An analog to digital converter comprising a reference signal supply means having a normal speed of operation to produce weighted steps in the magnitude of a reference signal, control means responsive to said reference signal and to an unknown signal to be digitized and operative to control said supply means to achieve an equality between said reference signal and said unknown signal, and speed-up means connected to said control means and said supply means and being responsive to the magnitude of the error between said reference signal and said unknown signal and selectively operative to directly increase the speed of operation of said supply means in direct proportion to the magnitude of said error.

7. The analog to digital converter recited in claim 5 wherein each said bidirectional stepping means comprises decade counter means, said reference signal supplying means comprises a decade resistance network and a plurality of switching means, each of said switching means connected to a separate terminal provided by said decade resistance means and to said signal comparing means whereby said weighted steps of said reference signal are provided to said comparing means, and said sequential energizing signal supply means comprises oscillator means operative to supply a fixed frequency signal.

8. The analog to digital converter recited in claim 7 wherein said signal gate means comprises a plurality of gate means and a plurality of separate amplifier means, separate gate means connected between different amplifier means and different stepping means, each said amplifier means operative to amplify said error between the compared signals whereby different magnitude signals are produced by each amplifier means, each said gate means selectively operative to transmit signals from said energizing signal supply means only in response to the application of the proper magnitude signal from said amplifier means.

9. The analog to digital converter recited in claim 5 wherein said signal comparing means comprises impedance means, said reference signal and said unknown signal being connected in opposition across said impedance means.

References Cited by the Examiner

UNITED STATES PATENTS 3,124,794 3/1964 Patmore ------------ 340—347

MAYNARD R. WILBUR, *Primary Examiner.*

DARYL W. COOK, *Examiner.*

W. J. KOPACZ, *Assistant Examiner.*